(12) United States Patent
Jo et al.

(10) Patent No.: US 11,394,390 B2
(45) Date of Patent: Jul. 19, 2022

(54) ANALOG/DIGITAL CONVERTER

(71) Applicant: Nippon Telegraph and Telephone Corporation, Tokyo (JP)

(72) Inventors: Teruo Jo, Tokyo (JP); Hiroshi Yamazaki, Tokyo (JP); Munehiko Nagatani, Tokyo (JP); Hiroshi Hamada, Tokyo (JP); Hideyuki Nosaka, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 17/272,886

(22) PCT Filed: Aug. 21, 2019

(86) PCT No.: PCT/JP2019/032569
§ 371 (c)(1),
(2) Date: Mar. 2, 2021

(87) PCT Pub. No.: WO2020/050023
PCT Pub. Date: Mar. 12, 2020

(65) Prior Publication Data
US 2021/0320667 A1    Oct. 14, 2021

(30) Foreign Application Priority Data

Sep. 4, 2018    (JP) .............................. JP2018-165111

(51) Int. Cl.
*H03M 1/06*    (2006.01)
*H03H 17/02*    (2006.01)

(52) U.S. Cl.
CPC .......... *H03M 1/0626* (2013.01); *H03H 17/02* (2013.01)

(58) Field of Classification Search
CPC ........ H03M 3/40; H03M 3/436; H03M 3/468; H03M 1/12; H03M 3/38; H03M 3/402; H03M 3/418; H03M 3/452; H03M 1/002; H03M 3/34; H03M 3/392; H03M 1/34; H03M 1/36; H03M 3/322; H03M 3/412; H03M 3/43; H03M 3/456; H03M 3/47;
(Continued)

(56) References Cited

U.S. PATENT DOCUMENTS 6,009,130 A * 12/1999 Lurey ...................... H04L 1/06
375/349
7,193,544 B1 * 3/2007 Fitelson ................ H03M 3/396
341/143
(Continued)

OTHER PUBLICATIONS

Raybon, et al., "160-Gbaud coherent receiver based on 100-GHz bandwidth, 240-GS/s analog-to-digital conversion," OFC 2015 Conference, NY, USA, 2015, 3 pages.

*Primary Examiner* — Linh V Nguyen
(74) *Attorney, Agent, or Firm* — Slater Matsil, LLP

(57) ABSTRACT

A wide-band analog input signal is converted into a digital output signal on the basis of a band division method without the need for filter circuits. An analog processing block $A_j$ (j=2 to N, where N is an integer) down-converts an analog input signal $S_x$ using a cutoff frequency fj-1 of a channel $CH_{j-1}$ and A/D-converts an analog signal $S_{aj}$ acquired as a result. A digital processing block $B_j$ doubles the signal strength of a first digital signal $S_{1j}$ acquired by $A_j$, subtracts a third digital signal $S_{3j-1}$ of the channel $CH_{j-1}$ from a second digital signal $S_{2j}$ acquired as a result, up-converts the acquired third digital signal $S_{3j}$ using the cutoff frequency $f_{j-1}$, and outputs the result to an adder as a channel output signal $S_{yj}$ of a corresponding channel $CH_j$.

9 Claims, 4 Drawing Sheets

(58) Field of Classification Search
CPC ..... H03M 3/502; H03M 7/304; H04B 1/001;
H04B 1/0057; H04B 1/109; H04B
10/2575; H04B 10/25754; H04B 7/0817;
H04L 27/38; H04L 5/001; H04L 27/10;
H04L 27/22; H04L 27/3405; H04L
2027/0051; H04L 2027/0055; H04L
27/0014; H04L 27/2272; H04L 27/2649;
H04L 7/0079; H04L 7/0091; H04L
7/0331; H04L 7/0338
USPC ................ 341/140–142, 118–121, 155, 159
See application file for complete search history.

(56) References Cited

U.S. PATENT DOCUMENTS

| | | | | |
|---|---|---|---|---|
| 7,236,757 | B2* | 6/2007 | Raghavan | H04L 27/2601 |
| | | | | 455/114.2 |
| 7,324,036 | B2* | 1/2008 | Petre | H03M 1/121 |
| | | | | 341/110 |
| 8,526,543 | B2* | 9/2013 | Chrabieh | H04L 27/3863 |
| | | | | 375/324 |
| 8,644,376 | B2* | 2/2014 | Jiang | H04N 5/335 |
| | | | | 375/240 |
| 8,836,552 | B1* | 9/2014 | Tietjen | H03M 1/1038 |
| | | | | 341/118 |
| 9,621,175 | B2* | 4/2017 | Pagnanelli | H03M 3/404 |
| 2014/0169501 | A1* | 6/2014 | Nazarathy | H04L 27/2663 |
| | | | | 375/316 |
| 2017/0041068 | A1* | 2/2017 | Murakowski | H04B 10/60 |
| 2017/0310520 | A1* | 10/2017 | Aghtar | H04B 1/0053 |
| 2020/0136663 | A1* | 4/2020 | Shanan | H04B 1/10 |
| 2020/0177213 | A1* | 6/2020 | Oh | H04B 1/0057 |

* cited by examiner

ANALOG/DIGITAL CONVERTER

CROSS-REFERENCE TO RELATED APPLICATIONS

This application is a national phase entry of PCT Application No. PCT/JP2019/032569, filed on Aug. 21, 2019, which claims priority to Japanese Application No. 2018-165111, filed on Sep. 4, 2018, which applications are hereby incorporated herein by reference.

TECHNICAL FIELD

The present invention relates to an analog-to-digital converter that converts analog input signals into digital signals individually in each frequency band thereof, and then synthesizes the converted signals into one on a frequency axis and outputs the result.

BACKGROUND

An Analog-to-Digital Converter (ADC) used in optical communication, measuring instruments, and so on is preferably, from the viewpoint of circuit integration, manufactured by a CMOS process in which integration with a Digital Signal Processor (DSP) is easy. However, a CMOS process has a narrow bandwidth, meaning that there is a limit on the extent to which the bandwidth of the ADC can be widened.

A band division method using a frequency converter manufactured by a process having a wider bandwidth has been proposed in the current system as a technique for widening the bandwidth of an ADC (see NPL 1 and so on, for example). FIG. 4 is a block diagram showing a configuration of a conventional analog-to-digital converter. FIG. 4 shows a case in which a frequency band W of an analog input signal Sx is divided into N partial bands Wi (i=1 to N, N being an integer), and signal components of the respective partial bands Wi are A/D-converted individually on channels (processing systems) CHi provided respectively for the partial bands Wi.

As shown in FIG. 4, a conventional analog-to-digital converter 50 includes, as processing blocks for each CHi, an analog processing block Ai of an analog processing circuit portion 50A and a digital processing block Bi of a digital processing circuit portion 50B.

First, in each Aj (j=2 to the integer N) of the analog processing circuit portion $50A_j$ a filter 61 extracts a signal s1j of a corresponding partial band Wj from the analog input signal Sx having the wide frequency band W. Next, a frequency converter 62 down-converts s1j to a low frequency-side signal S2j using a corresponding local signal fj. Next, a sub A/D converter 63 (SADC) converts S2j into a digital signal S3j.

Next, in each $B_j$ of the digital processing circuit portion $50B_j$ a frequency converter 64 up-converts S3j acquired by the corresponding Aj using a local signal fj and outputs a channel output signal syj of the CHj to an adder 70.

In A1 of the analog processing circuit portion $50A_i$, meanwhile, the filter 61 extracts a signal s11 of the corresponding partial band W1 from the analog input signal Sx having the wide frequency band W. Next, s11 is converted into a digital signal S31 by the sub A/D converter 63 (SADC) without being down-converted.

Next, in B1 of the digital processing circuit portion $50B_i$, S3j acquired by A1 is output directly to the adder 70 as a channel output signal sy1 of CH1 without being up-converted.

Next, the adder 70 generates a digital output signal Sy corresponding to the original analog input signal Sx by adding together the channel output signals syi of the respective channels CHi so as to synthesize the signals on a frequency axis, and then outputs the generated digital output signal Sy.

CITATION LIST

Non Patent Literature

NPL1—G. Raybon, et al., "160-Gbaud coherent receiver based on 100-GHz bandwidth, 240-GS/s analog-to-digital conversion", M2G. 1. pdf, OFC 2015 Conference Papers, Optical Fiber Communication Conference (OFC), 2015.

SUMMARY

Technical Problem

With this conventional technique, however, a plurality of filter circuits are required in order to extract the signals of the partial bands Wi on the input side, and these filter circuits lead to an increase in circuit area. Moreover, manufacturing filter circuits that satisfy desired filter characteristics (center frequency, bandwidth, rejection, and so on) at high frequencies with a high degree of precision results in an increase in the complexity of the circuit configuration.

Embodiments of the present invention have been designed to solve these problems, and an object thereof is to provide an analog-to-digital converter that can convert a wi de-band analog input signal into a digital output signal on the basis of a band division method without the need for filter circuits.

Means for Solving the Problem

To achieve this object, an analog-to-digital converter according to embodiments of the present invention includes N analog processing blocks Ai provided for respective channels CHi (i=1 to N, N being an integer), the channels CHi being acquired by dividing a frequency band corresponding to an analog input signal Sx into N parts, in order to process analog signals of the corresponding channels CHi, N digital processing blocks Bi provided for the respective channels CHi in order to process digital signals of the corresponding channels CHi, and an adder that outputs a digital output signal Sy corresponding to the analog input signal Sx by adding together channel output signals Syi from the channels CHi, the channel output signals Syi being acquired by the digital processing blocks Bi, so as to synthesize the channel output signals Syi on a frequency axis, wherein an analog processing block Aj (j=2 to the integer N) includes a frequency converter that down-converts the analog input signal Sx using a cutoff frequency fj-1 of a channel CHj-1, and a sub A/D converter that A/D-converts an analog signal Saj acquired by the frequency converter, a digital processing block Bj includes a multiplier that doubles a signal strength of a first digital signal S1j acquired by the sub A/D converter of the analog processing block Aj, a subtractor that subtracts a third digital signal S3j-1 relating to the channel CHj-1 from a second digital signal S2j acquired by the multiplier, and outputs a third digital signal S3j of a corresponding channel $CH_j$, and a frequency converter that up-converts the third digital signal Sgj acquired by the subtractor using the cutoff frequency fj-1 and outputs the result to the adder as a channel output signal Syj of the corresponding channel CHj, an analog processing block A1 includes a sub A/D converter that A/D-converts the analog input signal Sx, and a digital processing block B1 outputs a first digital signal S11 acquired by the sub A/D converter of the analog processing block A1 as a third digital signal of a corresponding channel CH1, and also outputs the first digital signal S11 to the adder as a channel output signal Sy1 of the corresponding channel CH1.

Further, in an example configuration of the analog-to-digital converter according to embodiments of the present invention, described above, the digital processing blocks Bi each include a digital filter that compensates for a frequency characteristic in a corresponding partial band Wi in the band of a first output signal S1t from the analog processing block Ai of the corresponding channel CHi on the basis of an inverse transfer function of a signal path through the analog processing block Ai.

Effects of Embodiments of the Invention

According to embodiments of the present invention, a wide-band analog input signal can be converted into a digital output signal on the basis of a band division method without the need for filter circuits. Hence, it is possible to avoid increases in the circuit area and the complexity of the circuit configuration, these increases being caused by filter circuits, and as a result, an analog-to-digital converter can easily be manufactured by a CMOS process in which integration with a digital signal processor (DSP) is easy.

DETAILED DESCRIPTION OF ILLUSTRATIVE EMBODIMENTS

Next, embodiments of the present invention will be described with reference to the figures.

First Embodiment

Figure 1:
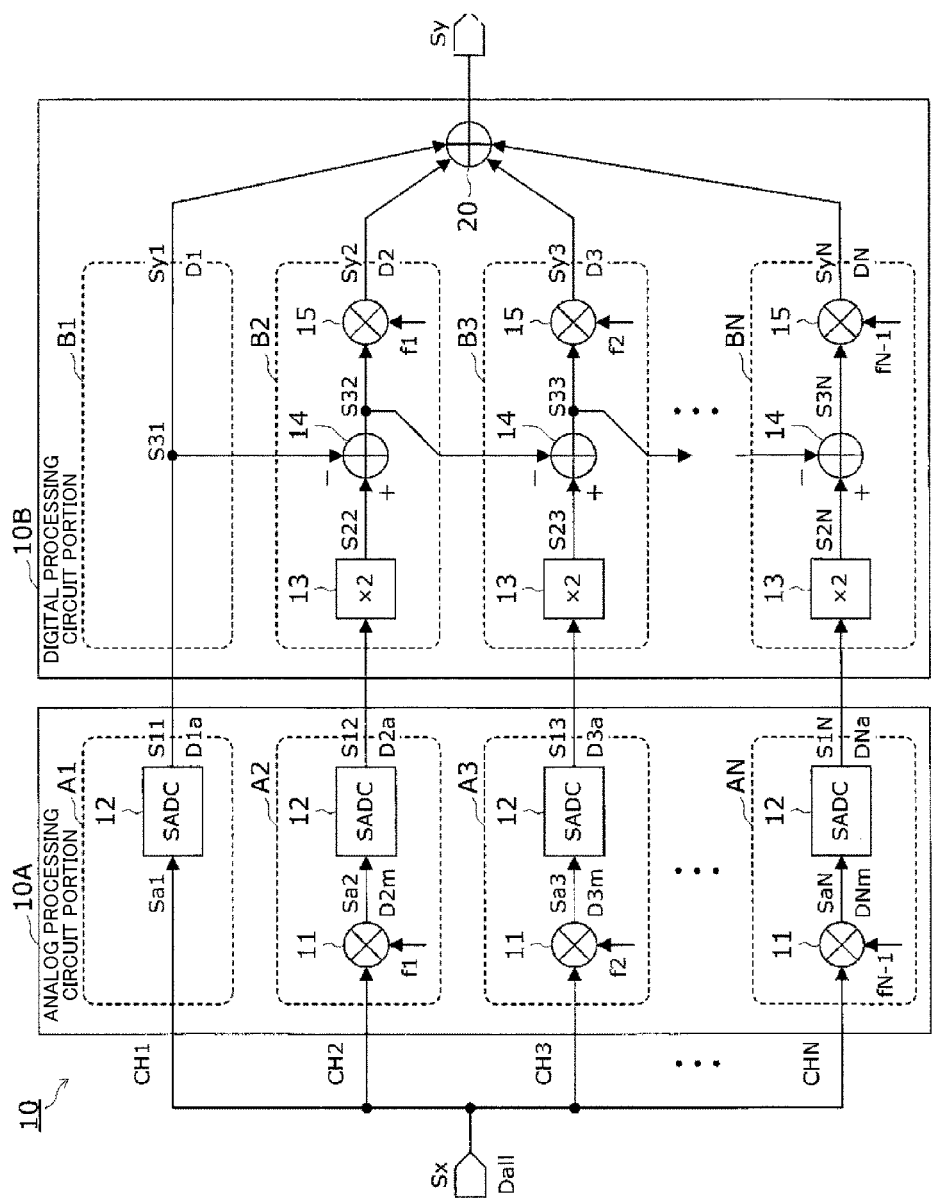
FIG. 1 is a block diagram showing a configuration of an analog-to-digital converter according to a first embodiment.

First, referring to FIG. 1, an analog-to-digital converter 10 according to a first embodiment of the present invention will be described. FIG. 1 is a block diagram showing a configuration of an analog-to-digital converter according to the first embodiment.

The analog-to-digital converter 10 is a circuit that A/D-converts an analog input signal Sx on the basis of a band division method and outputs a digital output signal Sy.

As shown in FIG. 1, the analog-to-digital converter 10 includes, as main circuit portions, an analog processing circuit portion 10A that performs analog signal processing for the purpose of A/D conversion, and a digital processing circuit portion 10B that performs digital signal processing for the purpose of A/D conversion. The analog processing circuit portion 10A is constituted by various circuit components, while the digital processing circuit portion 10B is constituted by a calculation processing circuit in which a multiprocessor such as a DSP or a CPU cooperates with a program.

The analog-to-digital converter 10 according to this embodiment has a function for generating and outputting the digital output signal Sy corresponding to the original analog input signal Sx by dividing a frequency band W of Sx into N consecutive partial bands Wi (i=1 to N, N being an integer), individually A/D-converting signal components of the respective partial bands Wi on channels (processing systems) CHi provided respectively for the partial bands Wi, and synthesizing digital signals acquired as a result on a frequency axis.

Note that the partial bands Wi corresponding to channels CH1, CH2, CH3, . . . , CHN are set respectively at DC (direct current component) to f1, f1 to f2, f2 to f3, . . . , fN−1 to fN, and the respective bandwidths thereof are assumed to be equal. Note that a frequency fi denotes a frequency that is i times larger than f1, i being an integer. Further, signal components corresponding to CH1, CH2, CH3, . . . , CHN are expressed as D1(f), D2(f), D3(f), . . . , DN(f). Accordingly, a total signal component Dall(f) of Sx is expressed by D1(f)+D2(f)+D3(f)+ . . . +DN(f).

The analog processing circuit portion 10A includes N analog processing blocks Ai provided for the respective channels CHi in order to process the analog signals of the channels CHi.

Further, the digital processing circuit portion 10B includes an adder 20 and N digital processing blocks Bi. The digital processing blocks Bi are provided for the respective channels CHi in order to process the digital signals of the channels CHi. The adder 20 is provided so as to be shared by the channels CHi, and the adder 20 generates and outputs Sy corresponding to the original Sx by adding together the channel output signals Syi of the respective channels CHi, which are acquired by the digital processing blocks Bi, so as to synthesize (connect) the channel output signals Syi on a frequency axis.

Analog processing blocks Aj (j=2 to the integer N), among the analog processing blocks Ai, each include a frequency converter (down-converter) 11 and a sub A/D converter (SADC) 12. The frequency converter (down-converter) 11 down-converts Sx using a cutoff frequency (the lower limit frequency of CHj) fj-1 of CHj-1, which is a local signal. The sub A/D converter (SADC) 12 A/D-converts an analog signal Saj acquired by the frequency converter 11.

Further, an analog processing block A1, among the analog processing blocks Ai, includes the sub A/D converter (SADC) 12 for A/D-converting Sx (=Sa1). Note that A1 does not include the frequency converter 11.

Digital processing blocks Bj (j=2 to the integer N), among the digital processing blocks Bi, each include a subtractor 14 and a frequency converter (up-converter) 15. The subtractor 14 outputs, with a multiplier (×2) 13 for doubling the signal strength of a first digital signal S1j acquired by the sub A/D converter 12 of Aj, a third digital signal S3j of CHj by subtracting a third digital signal S3j-1 relating to CHj-1 from a second digital signal S2j acquired by the multiplier 13. The frequency converter (up-converter) 15 up-converts the third digital signal S3j acquired by the subtractor 14 to an upper-side waveband using the cutoff frequency (the lower limit frequency of CHj) fj-1 of CHj-1, which is a local signal, and outputs the result to the adder 20 as the channel output signal Syj of CHj.

Further, a digital processing block B1, among the digital processing blocks Bi, has a function for outputting a first digital signal S11 acquired by the sub A/D converter 12 of A1 as a third digital signal S31 of CH1, and a function for outputting the same first digital signal S11 to the adder 20 as a channel output signal Sy1 of CH1.

Operations of First Embodiment

Next, referring to FIG. 1, operations of the analog-to-digital converter 10 according to this embodiment will be described. To facilitate understanding, a case in which the number N of divided bands is N=3 will be described below as an example. The present invention is not limited thereto, however, and may be applied similarly to cases in which N=2 or N>3.

The analog input signal Sx is input into the analog processing blocks A1, A2, A3 corresponding to the respective channels CH1, CH2, CH3.

First, in A1 of CH1, since A1 does not include the frequency converter 11, Sx (=Sa1) is converted into the first digital signal S11 by the sub A/D converter 12. Typically, an A/D converter itself has a low pass filter characteristic. Therefore, in the sub A/D converter 12, in accordance with the low pass filter characteristic thereof, only a signal component $D1a(f)$ in a range of DC (direct current component) to f1, within the total signal component Dall(f) of Sx, is subjected to A/D conversion and output as S11.

Hence, $D1a(f)$ matches the signal component $D1(f)$ of CH1, and is expressed by the following formula (1).

Formula 1

$$D1a(f) = D1(f) \qquad (1)$$

Next, in A2 of CH2, Sx is frequency-converted by the frequency converter 11. At this time, Dall(f) is input into an RF port of the frequency converter 11, and the cutoff frequency f1 of CH1 is input into an LO port. Accordingly, a signal component $D2m(f)$ acquired by down-converting Dall(f) using f1 is output from an IF port as an analog signal Sa2. $D2m(f)$ is expressed by the following formula (2).

Formula 2

$$D2m(f) = \frac{D1(f - f1)}{2} + \frac{D1^*(-f + f1)}{2} + \frac{D2(f + f1)}{2} + \frac{D2(f - f1)}{2} + \frac{D3(f + f1)}{2} + \frac{D3(f - f1)}{2} \qquad (2)$$

Note that "*" in each formula represents a complex conjugate. The frequency converter 11 of A2 is constituted by a mixer of a double side band (DBS), wherein the ports have infinite bandwidth and each port is completely isolated. Note, however, that an actual mixer has a limited bandwidth, and therefore, in the frequency converter 11 of A2, it is sufficient for the RF port to have a wider bandwidth than DC to f2 and for the IF port to have a bandwidth of at least DC to f1.

Next, $D2m(f)$ acquired by the frequency converter 11 is converted into a first digital signal S12 by the sub A/D converter 12 of A2. At this time, similarly to CH1, the sub A/D converter 12, due to the low pass filter characteristic thereof, A/D-converts only a signal component $D2a(f)$ of $D2m(f)$ in a range of DC (direct current component) to f1. $D2a(f)$ is expressed by the following formula (3).

Formula 3

$$D2a(f) = \frac{D1^*(-f + f1)}{2} + \frac{D2(f + f1)}{2} \qquad (3)$$

Next, in A3 of CH3, Sx is frequency-converted by the frequency converter 11. At this time, Dall(f) is input into the RF port of the frequency converter 11, and the cutoff frequency f2 of CH2 is input into the LO port. Accordingly, a signal component $D3m(f)$ acquired by down-converting Dall(f) using f2 is output from the IF port as an analog signal Sa3. $D3m(f)$ is expressed by the following formula (4).

Formula 4

$$D3m(f) = \frac{D1(f - f2)}{2} + \frac{D1^*(-f + f2)}{2} + \frac{D2(f - f2)}{2} + \frac{D2^*(-f + f2)}{2} + \frac{D3(f - f2)}{2} + \frac{D3(f + f2)}{2} \qquad (4)$$

The frequency converter 11 of A3 is also constituted by a mixer of a double side band (DBS), wherein the ports have infinite bandwidth and each port is completely isolated. Note, however, that an actual mixer has a limited bandwidth, and therefore, in the frequency converter 11 of A3, it is sufficient for the RF port to have a wider bandwidth than f1 to f3 and for the IF port to have a bandwidth of at least DC to f1.

Next, $D3m(f)$ acquired by the frequency converter 11 is converted into a first digital signal S13 by the sub A/D converter 12 of A3. At this time, due to the low pass filter characteristic of the sub A/D converter 12, only a signal component $D3a(f)$ of $D3m(f)$ in a range of DC (direct current component) to f1 is subjected to A/D conversion. $D3a(f)$ is expressed by the following formula (5).

Formula 5

$$D3a(f) = \frac{D2^*(-f + f2)}{2} + \frac{D3(f + f2)}{2} \qquad (5)$$

Thus, the first digital signals Sn, S12, S13 acquired by the analog processing blocks A1, A2, A3 corresponding to the respective channels CH1, CH2, CH3 are input into the digital processing blocks B1, B2, B3 corresponding to the respective channels CH1, CH2, CH3.

First, in B1, the signal component $D1a(f)$ of S11 input therein is output to the adder 20 as the channel output signal Sy1 of CH1, which is constituted by the signal component $D1(f)$. Further, S11 is output to B2 as a third digital signal S31 of CH1.

Next, in B2, the signal component $D2a(f)$ of S12 input therein is doubled by the multiplier 13, whereupon the subtractor 14 subtracts the signal component $D1a(f)$ of the third digital signal S31 of CH1 from a second digital signal S22 acquired by the multiplier 13. The frequency converter 15 up-converts a third digital signal S32 acquired by the subtractor 14 to the original frequency band using the cutoff frequency f1 of CH1, whereupon the resulting signal is output to the adder 20 as a channel output signal Sy2 of CH2, which is constituted by the signal component $D2(f)$.

D2(*f*) acquired by the digital signal processing executed in B2 is expressed by the following formula (6).

Formula 6

$$D2(f)=2\times D2a(f-f1)-D1a^*(-f) \quad (6)$$

Next, in B3, the signal component D3*a*(*f*) of S13 input therein is doubled by the multiplier 13, whereupon the subtractor 14 subtracts the signal component D2*a*(*f*) of the third digital signal S32 of CH2 from the second digital signal S23 acquired by the multiplier 13. The frequency converter 15 up-converts a third digital signal S33 acquired by the subtractor 14 to the original frequency band using the cutoff frequency f2 of CH2, whereupon the resulting signal is output to the adder 20 as a channel output signal Sy3 of CH3, which is constituted by the signal component D3(*f*).

D3(*f*) acquired by the digital signal processing executed in B3 is expressed by the following formula (7).

Formula 7

$$D3(f)=2\times D3a(f-f2)-D2a^*(-f) \quad (7)$$

Thereafter, the signal components D1(*f*), D2(*f*), D3(*f*) of the channel output signals Sy1, Sy2, Sy3 of CH1, CH2, CH3, output from B1, B2, B3, are synthesized on the frequency axis by the adder 20. At this time, the frequency bands of D1(*f*), D2(*f*), D3(*f*) are DC (direct current component) to f1, f1 to f2, and f2 to f3, respectively, and therefore the digital output signal Sy corresponding to the original analog input signal Sx is output from the adder 20.

Simulation Results

Figure 2:
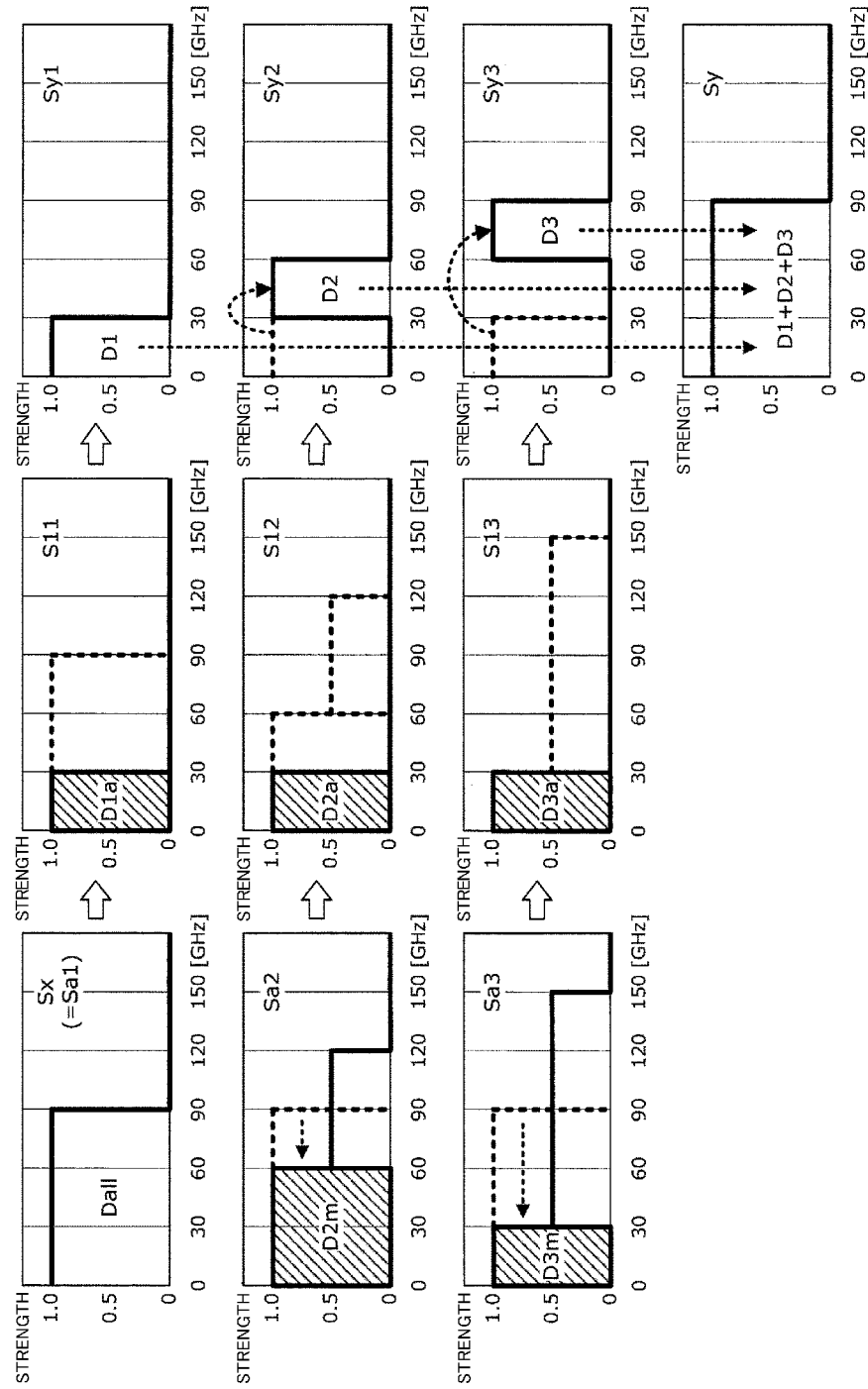
FIG. 2 is an illustrative view showing simulation results according to the first embodiment.

Next, referring to FIG. 2, simulation results relating to the operations of the analog-to-digital converter 10 according to this embodiment will be described. FIG. 2 is an illustrative view showing simulation results according to the first embodiment. A case in which the analog input signal Sx having a frequency band W of DC to 90 GHz, a strength of 1, and a random phase is divided into three (N=3) partial bands Wi (i=1, 2, 3) and the signal components of the respective partial bands Wi are individually A/D-converted on the channels (processing systems) CHi provided respectively for the partial bands Wi will be described below as an example. The present invention is not limited to this example, however, and may be applied similarly to cases in which N=2 or N>3.

First, in the analog processing block A1 of CH1, Sx is input directly into the sub A/D converter 12. At this time, the cutoff frequencies of the low pass filter characteristics exhibited by the sub A/D converters 12 of the respective channels are all 30 GHz (f1). Therefore, in A1, only the DC to 30 GHz signal component D1*a*(*f*) of Sx (=Sa1) is converted by the sub A/D converter 12 into the first digital signal S11 and output to the digital processing block B1 of CH1.

In B1, S11 input therein is output to the adder 20 as the channel output signal Sy1 of CH1, which includes the DC to 30 GHz signal component D1(*f*). Further, S11 is output to B2 as the third digital signal S31 of CH1.

In the analog processing block A2 of CH2, meanwhile, Sx is first multiplied by a 30 GHz (f1) local signal in the frequency converter 11 so as to be down-converted to the analog signal Sa2 including the signal component D2*m*(*f*). Next, similarly to CH1, only the DC to 30 GHz signal component D2*a*(*f*) of Sa2 is converted by the sub A/D converter 12 of A2 into the first digital signal S12 and output to the digital processing block B2 of CH2.

In B2, the multiplier 13 converts S12 input therein into the second digital signal S22 having twice the signal strength, whereupon the subtractor 14 subtracts the signal component D1*a*(*f*) corresponding to the third digital signal S31 of CH1 from S22. The converter 15 of B2 up-converts the third digital signal S32 acquired as a result to the channel output signal Sy2 of CH2, which includes the 30 to 60 GHz signal component D2(*f*), on the basis of a 30 GHz (f1) local signal, and outputs the result to the adder 20.

Similarly, in the analog processing block A3 of CH3, Sx is first multiplied by a 60 GHz (f2) local signal in the frequency converter 11 so as to be down-converted to the analog signal Sa3 including the signal component D3*m*(*f*). Next, only the DC to 30 GHz signal component D3*a*(*f*) of Sa3 is converted by the sub A/D converter 12 of A3 into the first digital signal S13 and output to the digital processing block B3 of CH3.

In B3, the multiplier 13 converts S13 input therein into the second digital signal S23 having twice the signal strength, whereupon the subtractor 14 subtracts the signal component D2*a*(*f*) corresponding to the third digital signal S32 of CH2 from S23. The converter 15 of B3 up-converts the third digital signal S33 acquired as a result to the channel output signal Sy3 of CH3, which includes the 60 to 90 GHz signal component D3(*f*), on the basis of a 60 GHz (f2) local signal, and outputs the result to the adder 20.

Next, the adder 20 synthesizes the channel output signals Sy1, Sy2, Sy3 on the same frequency axis, and outputs the result as the digital output signal Sy corresponding to the original analog input signal Sx.

Effects of First Embodiment

Hence, in this embodiment, in the analog processing block Aj (j=2 to the integer N), the frequency converter 11 down-converts the analog input signal Sx using the cutoff frequency fj-1 of the channel CHj-1, whereupon the sub A/D converter 12 A/D-converts the analog signal Saj acquired by the frequency converter 11. Then, in the digital processing block Bj, the multiplier 13 doubles the signal strength of the first digital signal S1*j* acquired by the sub A/D converter 12 of the analog processing block Aj, whereupon the subtractor 14 subtracts the third digital signal S3*j*-1 of the channel CHj-1 from the second digital signal S2*j* acquired by the multiplier 13 and outputs the third digital signal S3*j* of the corresponding channel CHj. The frequency converter 15 up-converts the third digital signal S3*j* acquired by the subtractor 14 using the cutoff frequency fj-1 and outputs the result to the adder 20 as the channel output signal Syj of the corresponding channel CHj.

Further, in the analog processing block A1, the sub A/D converter 12 A/D-converts the analog input signal Sx, whereupon the digital processing block B1 outputs the first digital signal S11 acquired by the sub A/D converter 12 of the analog processing block A1 as the third digital signal S31 of the corresponding channel CH1 and also outputs the first digital signal S11 to the adder 20 as the channel output signal Sy1 of the corresponding channel CH1.

The adder 20 adds together the channel output signals Syi (i=1 to the integer N) of the channels CHi, acquired by the respective digital processing blocks Bi, thereby synthesizing the channel output signals Syi on a frequency axis, and as a result outputs the digital output signal Sy corresponding to the analog input signal Sx.

Thus, the channel output signals Syi including the signal components corresponding respectively to the partial bands Wi are acquired by signal processing on the digital processing circuit portion 10B side without providing filter circuits corresponding to the respective partial bands Wi on the analog processing circuit portion 10A side. Accordingly, the wide-band analog input signal Sx can be converted into the digital output signal Sy on the basis of a band division method without the need for filter circuits. Hence, it is possible to avoid increases in the circuit area and the complexity of the circuit configuration, these increases being caused by filter circuits, and as a result, an analog-to-digital converter can easily be manufactured by a CMOS process in which integration with a digital signal processor (DSP) is easy.

Second Embodiment

Figure 3:
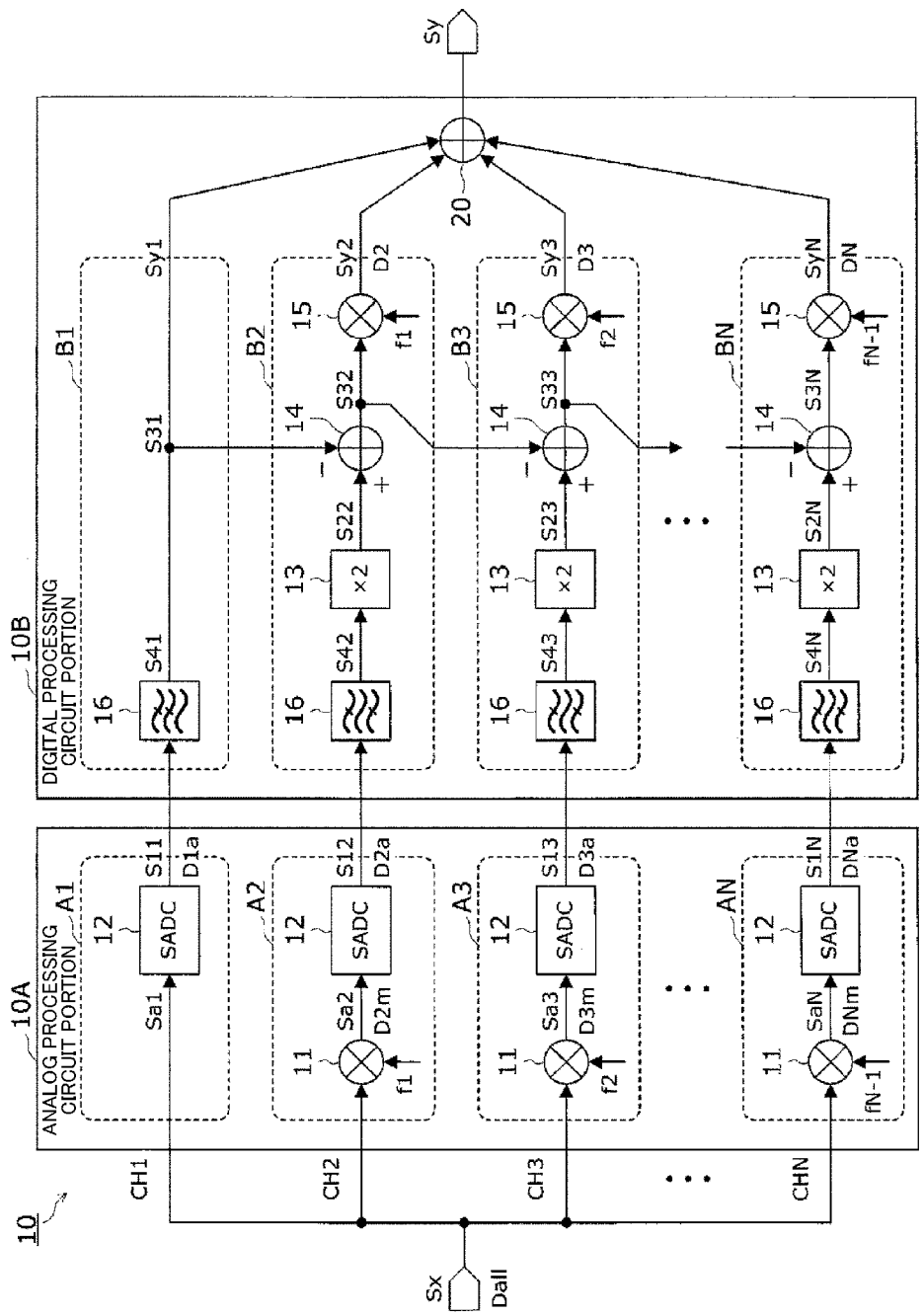
FIG. 3 is a block diagram showing a configuration of an analog-to-digital converter according to a second embodiment.
Figure 4:
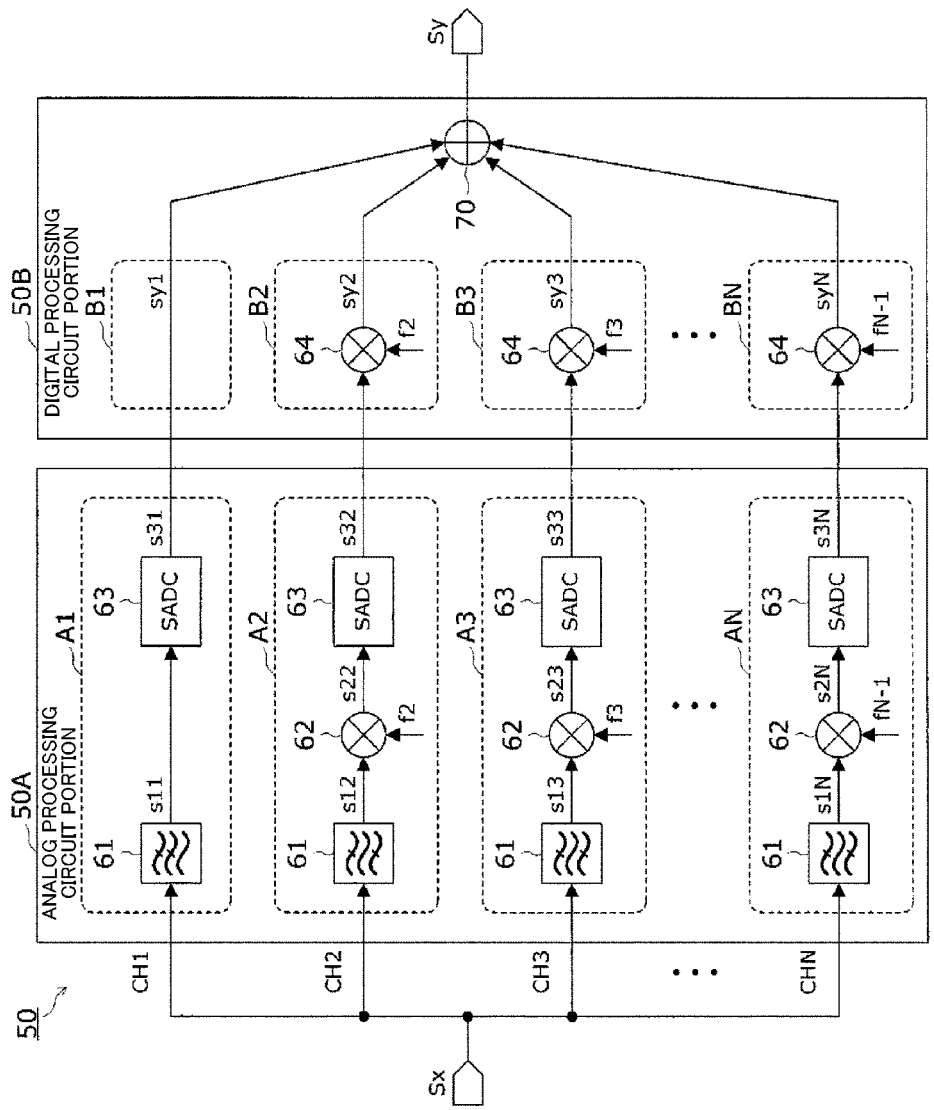
FIG. 4 is a block diagram showing a configuration of a conventional analog-to-digital converter.

Next, referring to FIG. 3, the analog-to-digital converter 10 according to a second embodiment of the present invention will be described. FIG. 3 is a block diagram showing a configuration of the analog-to-digital converter according to the second embodiment.

Typically, a circuit component may have a frequency characteristic in which the strength and phase of the output signal vary relative to the input signal, for example a characteristic in which the pass characteristic decreases or a ripple occurs in the pass characteristic as the frequency increases. When a circuit component used in the analog processing blocks Ai of the analog processing circuit portion 10A has a non-flat frequency characteristic such as that described above, this leads to deterioration of the SN ratio of the channel output signal Syi during the addition and subtraction processing performed in the digital processing blocks Bi of the digital processing circuit portion 10B.

In this embodiment, in response to cases of this type, a digital filter is provided at the input stage of each digital processing block Bi in order to compensate for the frequency characteristics of the respective channels CHi in the partial bands Wi.

More specifically, in this embodiment, as shown in FIG. 3, each digital processing block Bi includes a digital filter 16 that compensates for the frequency characteristic in a corresponding partial band Wi in the band of the first output signal Sit from the analog processing block Ai of the corresponding channel CHi on the basis of an inverse transfer function of a signal path through the analog processing block Ai. All other configurations of this embodiment are similar to the first embodiment, and therefore detailed description thereof has been omitted.

The inverse transfer function used by the digital filter 16 may be created by inputting a known test signal such as an impulse signal or a multitone signal, for example, into the actual analog processing block Ai and creating the inverse transfer function on the basis of the difference between the first digital signal S1i output from the Ai and the test signal.

Thus, in B2 of the channel CHj (j=2 to the integer N), the digital filter 16 compensates for the frequency characteristic of the first digital signal S1j input therein in the corresponding partial band Wi, whereupon a fourth digital signal S4j acquired as a result is input into the multiplier 13. All other operations of this embodiment are similar to the first embodiment, and therefore detailed description thereof has been omitted.

Effects of Second Embodiment

Hence, in this embodiment, the digital filter 16 of the digital processing block Bi compensates for the frequency characteristic in a corresponding partial band Wi in the band of the first output signal Si1 from the analog processing block Ai of the corresponding channel CH1 on the basis of the inverse transfer function of the signal path through the analog processing block Ai.

Thus, deterioration of the SN ratio of the output signal Si4 caused by the frequency characteristic of a circuit component of the analog processing block Ai can be reduced, and as a result, A/D conversion can be performed with a high degree of precision.

Expansion of the Embodiments

The present invention was described above with reference to embodiments, but the present invention is not limited to the above embodiments. Various modifications that could be understood by a person skilled in the art may be applied to the configurations and details of the present invention within the scope of the present invention. Moreover, the embodiments may be implemented in any desired combinations providing no contradictions arise as a result.

REFERENCE SIGNS LIST

10 Analog-to-digital converter
10A Analog processing circuit portion
10B Digital processing circuit portion
A1, A2, A3, AN, Ai, Aj Analog processing block
B1, B2, B3, BN, Bi, Bj Digital processing block
11 Frequency converter
12 Sub A/D converter (SADC)
13 Multiplier
14 Subtractor
15 Frequency converter
16 Digital filter
20 Adder
CH1, CH2, CH3, CHN, CH1, CHj Channel
Sx Analog input signal
Sy1, Sy2, Sy3, SyN, Sy1, Syj Channel output signal
Sy Digital output signal
W Frequency band
Wi, Wj Partial band
Sa1, Sa2, Sa3, SaN, Sai, Saj Analog signal
S11, S12, S13, SiN, S1i, S1j First digital signal
S21, S22, S23, S2N, S2i, S2j Second digital signal
S31, S32, S33, S3N, S3i, S3j Third digital signal
S41, S42, S43, S4N, S4i, S4j Fourth digital signal

The invention claimed is:

1. An analog-to-digital converter comprising:
N analog processing blocks $A_i$, each of the N analog processing blocks $A_i$, corresponding to a respective one of channels $CH_i$, wherein i=1 to N and N is an integer, the channels $CH_i$ being acquired by dividing a frequency band corresponding to an analog input signal $S_x$ into N parts, the N analog processing blocks $A_i$ being configured to process analog signals of the channels $CH_1$;
N digital processing blocks $B_i$, each of the N digital processing blocks $B_i$ corresponding to a respective one of the channels $CH_i$, the N digital processing blocks $B_i$ being configured to process digital signals of the channels $CH_i$; and
an adder configured to output a digital output signal $S_y$ corresponding to the analog input signal $S_x$ by adding channel output signals $S_{yi}$ from the channels $CH_i$, the channel output signals $S_{yi}$ being acquired by the N digital processing blocks $B_i$, so as to synthesize the channel output signals $S_{yi}$ on a frequency axis;

wherein each analog processing block $A_j$ of the N analog processing blocks $A_i$ includes:
  a frequency converter configured to down-convert the analog input signal $S_x$ according to a cutoff frequency $f_{j-1}$ of a channel $CH_{j-1}$; and
  a sub A/D converter configured to A/D-convert an analog signal $S_{aj}$ acquired by the frequency converter;
wherein j=2 to N;
wherein each digital processing block $B_j$ of the N digital processing blocks $B_i$ includes:
  a multiplier configured to double a signal strength of a first digital signal $S_{1j}$ acquired by the sub A/D converter of the analog processing block $A_j$;
  a subtractor configured to:
    subtract a third digital signal $S_{3j-1}$ relating to the channel $CH_{j-1}$ from a second digital signal $S_{2j}$ acquired by the multiplier; and
    output a third digital signal $S_{3j}$ of a corresponding channel $CH_j$; and
  a frequency converter configured to up-convert the third digital signal $S_{3j}$ to obtain an up-converted third digital signal $S_{3j}$ and outputs the up-converted third digital signal $S_{3j}$ to the adder as a channel output signal $S_{yj}$ of the corresponding channel $CH_j$;
wherein an analog processing block $A_1$ of the N analog processing blocks $A_i$ includes a sub A/D converter configured to A/D-convert the analog input signal $S_x$; and
wherein a digital processing block $B_1$ of the N digital processing blocks $B_i$ outputs a first digital signal $S_{11}$ acquired by the sub A/D converter of the analog processing block $A_1$ as a third digital signal of a corresponding channel $CH_1$ and also outputs the first digital signal $S_{11}$ to the adder as a channel output signal $S_{y1}$ of the corresponding channel $CH_1$.

2. The analog-to-digital converter according to claim 1, wherein the N digital processing blocks $B_i$ each include a digital filter configured to compensate for a frequency characteristic in a corresponding partial band $W_i$ in a band of a first output signal $S_{i1}$ from an analog processing block $A_i$ of the respective one of the channels $CH_i$ based on an inverse transfer function of a signal path through the analog processing block $A_i$.

3. An analog-to-digital converter comprising:
N analog processing blocks $A_i$, each of the N analog processing blocks $A_i$ corresponding to a respective one of channels $CH_i$, wherein i=1 to N and N is an integer, the channels $CH_i$ being acquired by dividing a frequency band corresponding to an analog input signal $S_x$ into N parts, the N analog processing blocks $A_i$ being configured to process analog signals of the channels $CH_i$, wherein each analog processing block $A_j$ of the N analog processing blocks $A_i$ includes:
  a frequency converter configured to down-convert the analog input signal $S_x$ according to a cutoff frequency $f_{j-1}$ of a channel $CH_{j-1}$; and
  a sub A/D converter configured to A/D-convert an analog signal $S_{aj}$ acquired by the frequency converter, wherein j=2 to N;
N digital processing blocks $B_i$, each of the N digital processing blocks $B_i$ corresponding to a respective one of the channels $CH_i$, the N digital processing blocks $B_i$ being configured to process digital signals of the channels $CH_i$; and
an adder configured to output a digital output signal $S_y$ corresponding to the analog input signal $S_x$ by adding channel output signals $S_{yi}$ from the channels $CH_i$, the channel output signals $S_{yi}$ being acquired by the N digital processing blocks $B_i$, so as to synthesize the channel output signals $S_{yi}$ on a frequency axis,
wherein each digital processing block $B_j$ of the N digital processing blocks $B_i$ includes:
  a multiplier configured to double a signal strength of a first digital signal $S_{1j}$ acquired by the sub A/D converter of the analog processing block $A_j$;
  a subtractor configured to:
    subtract a third digital signal $S_{3j-1}$ relating to the channel $CH_{j-1}$ from a second digital signal $S_{2j}$ acquired by the multiplier; and
    output a third digital signal $S_{3j-1}$ of a corresponding channel $CH_j$; and
  a frequency converter configured to up-convert the third digital signal $S_{3j}$ to obtain an up-converted third digital signal $S_{3j}$ and outputs the up-converted third digital signal $S_{3j}$ to the adder as a channel output signal $S_{yj}$ of the corresponding channel $CH_j$.

4. An analog-to-digital converter according to claim 3, wherein an analog processing block $A_1$ of the N analog processing blocks $A_i$ includes a sub A/D converter configured to A/D-convert the analog input signal $S_x$.

5. An analog-to-digital converter according to claim 4, wherein a digital processing block $B_1$ of the N digital processing blocks $B_i$ is configured to output a first digital signal $S_{11}$ acquired by the sub A/D converter of the analog processing block $A_1$ as a third digital signal of a corresponding channel $CH_1$.

6. The analog-to-digital converter according to claim 3, wherein the N digital processing blocks $B_i$ each include a digital filter configured to compensate for a frequency characteristic in a corresponding partial band $W_1$ in a band of a first output signal $S_{i1}$ from an analog processing block $A_i$ of the respective one of the channels $CH_i$ based on an inverse transfer function of a signal path through the analog processing block $A_i$.

7. A method of operating an analog-to-digital converter, wherein the method comprises:
acquiring, by the analog-to-digital converter, channels $CH_i$ by dividing a frequency band corresponding to an analog input signal $S_x$ into N parts, the analog-to-digital converter comprising N analog processing blocks $A_i$, each of the N analog processing blocks $A_i$ corresponding to a respective one of the channels $CH_i$, wherein i=1 to N and N is an integer;
processing, by the N analog processing blocks $A_i$ analog signals of the channels $CH_i$;
processing, by N digital processing blocks $B_i$ comprised by the analog-to-digital converter, digital signals of the channels $CH_i$, each of the N digital processing blocks $B_i$ corresponding to a respective one of the channels $CH_i$; and
outputting, by an adder comprised by the analog-to-digital converter, a digital output signal $S_y$ corresponding to the analog input signal $S_x$ by adding channel output signals $S_{yi}$ from the channels $CH_i$, the channel output signals $S_{yi}$ being acquired by the N digital processing blocks $B_i$, so as to synthesize the channel output signals $S_{yi}$ on a frequency axis;
wherein each analog processing block $A_j$ of the N analog processing blocks $A_i$ includes:
  a frequency converter configured to down-convert the analog input signal $S_x$ according to a cutoff frequency $f_{j-1}$ of a channel $CH_{j-1}$; and a sub A/D converter configured to A/D-convert an analog signal $S_{aj}$ acquired by the frequency converter;

wherein j=2 to N;

wherein each digital processing block $B_j$ of the N digital processing blocks $B_i$ includes:

a multiplier configured to double a signal strength of a first digital signal $S_{1j}$ acquired by the sub A/D converter of the analog processing block $A_j$;

a subtractor configured to:
 subtract a third digital signal $S_{3j-1}$ relating to the channel $CH_{j-1}$ from a second digital signal $S_{2j}$ acquired by the multiplier; and
 output a third digital signal $S_{3j}$ of a corresponding channel $CH_j$; and a frequency converter configured to up-convert the third digital signal $S_{3j}$ to obtain an up-converted third digital signal $S_{3j}$ and outputs the up-converted third digital signal $S_{3j}$ to the adder as a channel output signal $S_{xj}$ of the corresponding channel $CH_j$;

wherein an analog processing block $A_1$ of the N analog processing blocks $A_i$ includes a sub A/D converter configured to A/D-convert, by a sub A/D converter of an analog processing block n the analog input signal $S_x$; and wherein a digital processing block $B_1$ of the N digital processing blocks $B_i$ outputs a first digital signal $S_{11}$ acquired by the sub A/D converter of the analog processing block $A_1$ as a third digital signal of a corresponding channel $CH_1$ and also outputs the first digital signal $S_{11}$ to the adder as a channel output signal $S_{y1}$ of the corresponding channel $CH_1$.

8. The method according to claim 7, wherein the N digital processing blocks $B_i$ each include a digital filter configured to compensate for a frequency characteristic in a corresponding partial band $W_i$ in a band of a first output signal $S_{i1}$ from an analog processing block $A_i$ of the respective one of the channels $CH_i$ based on an inverse transfer function of a signal path through the analog processing block $A_i$.

9. An analog-to-digital converter according to claim 4, wherein a digital processing block $B_1$ of the N digital processing blocks $B_i$ is configured to output the first digital signal $S_{11}$ to the adder as a channel output signal $S_{y1}$ of the corresponding channel $CH_1$.

* * * * *